(12) United States Patent
Von Borcke et al.

(10) Patent No.: US 7,939,885 B2
(45) Date of Patent: May 10, 2011

(54) SEMICONDUCTOR DEVICE AND METHOD OF MANUFACTURING A SEMICONDUCTOR DEVICE

(75) Inventors: Mathias Hans-Ulrich Alexander Von Borcke, Munich (DE); Markus Zundel, Egmating (DE); Uwe Schmalzbauer, Unterfohring (DE)

(73) Assignee: Infineon Technologies Austria AG, Villach (AT)

( * ) Notice: Subject to any disclaimer, the term of this patent is extended or adjusted under 35 U.S.C. 154(b) by 243 days.

(21) Appl. No.: 12/112,547

(22) Filed: Apr. 30, 2008

(65) Prior Publication Data

US 2008/0296668 A1 Dec. 4, 2008

(30) Foreign Application Priority Data

Apr. 30, 2007 (DE) .................. 10 2007 020 249

(51) Int. Cl.
*H01L 29/76* (2006.01)
(52) U.S. Cl. ........ 257/330; 257/331; 257/341; 257/773; 257/E29.257
(58) Field of Classification Search .................. 257/328, 257/330, 331, 341, 773, E29.257, 329
See application file for complete search history.

(56) References Cited

U.S. PATENT DOCUMENTS

| | | | |
|---|---|---|---|
| 6,144,085 A | 11/2000 | Barker | |
| 7,183,610 B2 * | 2/2007 | Pattanayak et al. | 257/333 |
| 7,504,303 B2 * | 3/2009 | Yilmaz et al. | 438/259 |
| 7,663,182 B2 * | 2/2010 | Mizokuchi et al. | 257/328 |
| 2008/0214004 A1 * | 9/2008 | Poelzl et al. | 438/689 |

FOREIGN PATENT DOCUMENTS

| | | |
|---|---|---|
| DE | 10 2004 009 602 | 9/2005 |
| WO | 2005 112128 | 11/2005 |

* cited by examiner

*Primary Examiner* — Tuan N. Quach
(74) *Attorney, Agent, or Firm* — Dicke, Billig & Czaja, PLLC

(57) ABSTRACT

A semiconductor device has a substrate having a plurality of neighboring trenches, and a contact area, one mesa stripe each being formed between two neighboring trenches. The contact area contacts mesa stripes and surrounds an opening region in which the contact area is not formed and which is formed such that the contact area contacts the same mesa stripes at two positions between which the opening region is arranged, and the opening region having a region of elongate extension which intersects the mesa stripes in a skewed or perpendicular manner.

17 Claims, 10 Drawing Sheets

FIGURE FOR ABSTRACT

US 7,939,885 B2

SEMICONDUCTOR DEVICE AND METHOD OF MANUFACTURING A SEMICONDUCTOR DEVICE

CROSS-REFERENCE TO RELATED APPLICATIONS

This Utility Patent Application claims priority from German Patent Application No. 102007020249.2, which was filed on Apr. 30, 2007, and is incorporated herein by reference in its entirety.

TECHNICAL FIELD

Embodiments relate to a semiconductor device and to a method of manufacturing a semiconductor device and, in one embodiment, to skewed embedding of sensor structures.

BACKGROUND

There is often demand for providing efficient overload protection in semiconductor devices, like for example power field-effect transistors. This may, for example, be done by embedding a sensor structure which exemplarily detects a sensor current, wherein this sensor current is proportional to a current through the power field-effect transistor, in a field of cells of a power field-effect transistor. When the sensor structure is embedded in a field of cells of the power field-effect transistor such that the leads are perpendicular (or parallel) to one of the sides of the field of cells/chip and/or the direction of trench stripes, the result may be semi-floating potential (body) regions along the leads. The semi-floating potential regions may, depending on the embedding depth of the sensor structure, be considerably longer than 200 μm or even be in the range of mm. Semi-floating potential regions are taken as regions which are geometrically long but not formed as an area, but only connected to a defined potential at the ends. With fast voltage pulses having very steep edges (like for example ISO pulses or ESD (electrostatic discharge) events), the result may be that the potential along such a semi-floating region and/or semi-floating potential region is dynamically strongly different. Close to contact points, the potential will follow the set value very quickly, however at the remotest position, it may still dynamically exhibit an unfavorable potential value such that gate oxide stress or even voltage breakdowns and damage may occur in neighboring trenches. Reliability risks and, in the worst case, local destruction of the power transistor are the results.

Embodiments thus deal with the field of optimum embedding of sensor structures in a large-area field of cells of a power transistor.

For these and other reasons, there is a need for the present invention.

SUMMARY

One embodiment provides a semiconductor device including a substrate having a plurality of neighboring trenches, and a contact area, one mesa stripe each being formed between two neighboring trenches. The contact area contacts the mesa stripes and surrounds an opening region in which no contact area is formed and which is shaped such that the contact area contacts the same mesa stripes at two positions between which the opening region is arranged, the opening region including an elongate extension region intersecting the mesa stripes in a skewed or perpendicular manner.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

Embodiments will be detailed subsequently referring to the appended drawings.

Before embodiments will be discussed in greater detail referring to the drawings, it is pointed out that, in the figures, same elements or elements having the same effect are provided with same or similar reference numerals, and that a repeated description of these elements is omitted.

DETAILED DESCRIPTION

Figure 1:
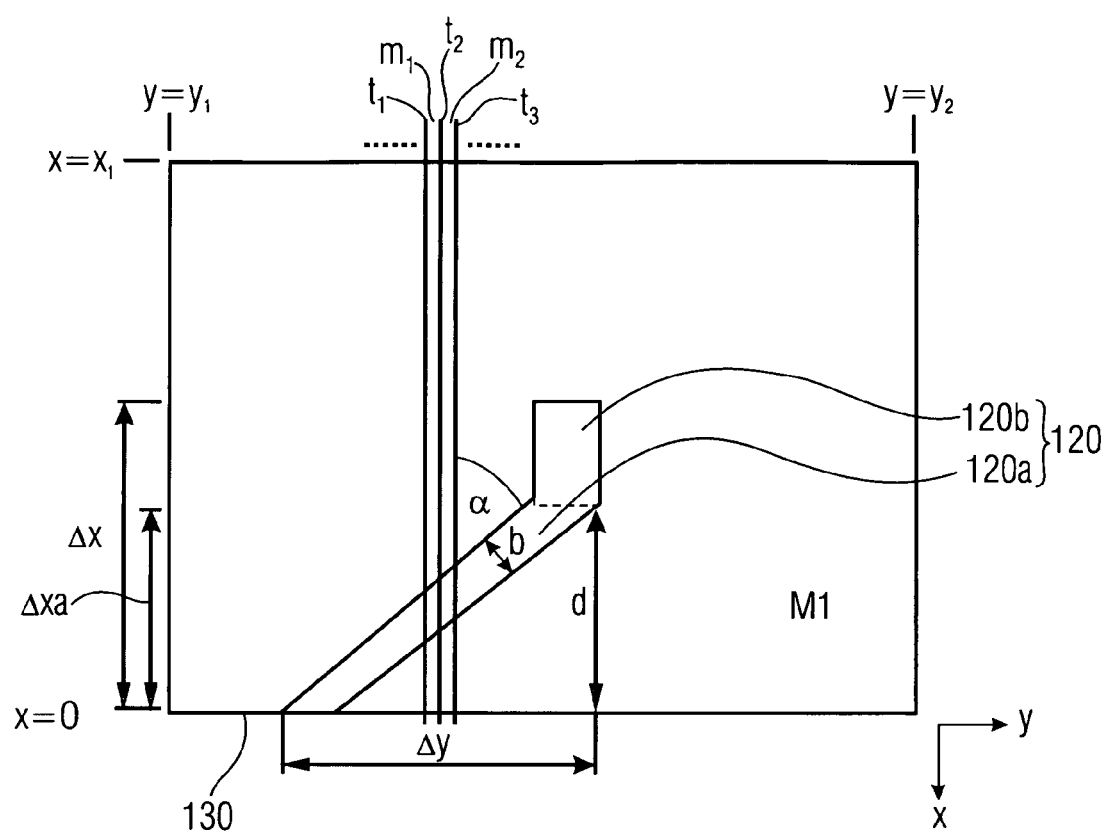
FIG. 1 is a schematic illustration of an opening region of a contact area for a semiconductor device according to an embodiment.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope. The following detailed description, therefore, is not to be taken in a limiting sense, and the scope is defined by the appended claims.

Embodiments relate to a semiconductor device, for example a power transistor or a power field-effect transistor, including a substrate which includes a plurality of neighboring trenches and in which a mesa stripe is formed between two respective neighboring trenches. A contact area contacting the mesa stripes is formed for contacting the semiconductor device, the contact area leaving out an opening region so that there will be no contacting of the mesa stripes by the contact region in the opening region. The opening region here is implemented such that the contact area contacts mesa stripes at two separate positions and that the opening region is located between the two separate positions. In addition, the opening region has an elongate extension and intersects the mesa stripes in a skewed or perpendicular manner. Specific embodiments of the opening region will be discussed in greater detail below.

The opening region within the semiconductor device may, for example, serve to embed another device, like for example a sensor structure, in the semiconductor device. Embodiments are based on the idea of optimizing macroscopic embedding of an exemplarily sensor and/or sensor structure. Macroscopic embedding here is taken as a geometrical shape of how the sensor structure of a device can be embedded in the field of cells of the neighboring trenches. It deals with optimum embedding of the sensor structure or a current sensor in the field of cells in the sense of the most homogeneous embedding possible on the microscopic level. Homogeneous embedding here exemplarily relates to the trench geometry, the potential regions which, in the course from the field of cells into the current sensor, should be as uniform as possible.

The neighboring trenches may exemplarily be arranged on a substrate surface and when the device exemplarily is a power field-effect transistor, the substrate side opposite the surface may exemplarily include a drain electrode (or drain) or drain region and source regions are formed along the mesa stripes. The source regions may exemplarily be formed by correspondingly doped regions within the mesa stripes and are contacted by the contact area. Body regions may exemplarily be formed between the source regions and the drain region. The source regions and the drain region usually exhibit equal doping of the semiconductor substrate and the body regions exhibit a corresponding complementary doping. Gate regions of the exemplarily power field-effect transistor may be formed within the trenches and are separated from the substrate and the contact area by an insulation. The insulation of the gate regions and body regions here is located such that when applying a corresponding voltage (the sign of which depends on the doping selected) to the gate regions, channels will form along a trench wall in the body regions so that a current can flow from the source regions to the drain region. Optionally, a higher doped layer may be deposited in the drain region and be contacted electrically to a drain electrode in order to improve a drain terminal.

Embedding the exemplary sensor structure in the power field-effect transistor just described may take place such that the contacting (contact area) is opened along the source regions in an opening region and the sensor structure is embedded in this opening region. Since the source regions and the body regions are no longer contacted within the opening region, the semi-floating potential regions mentioned may result. This will particularly be the case if, as is the case frequently, the body regions are through-contacted to the contact area. The through-contactings may, for example, be made by additional trenches, the consequence being that the body regions are connected to an equal potential as the source regions.

A simulation of potential error cases which may occur due to semi-floating potential regions has the summarizing result that semi-floating potential regions of a length of less than 100 μm are generally uncritical; this is what makes embedding allowing semi-floating regions of considerably less than 100 μm desirable. Like embodiments illustrate, this is possible when embedding is performed in a skewed manner. In contrast to skewed embedding, semi-floating potential regions over a length corresponding to an embedding depth of the structure embedded will result when using a type of embedding where the lead is parallel to the neighboring trenches. However, when skewed embedding is performed and a lead to the device embedded is skewed relative to the neighboring trenches, a considerable reduction in the length of semi-floating regions can be achieved in dependence on the angle in which the lead intersects the neighboring trenches. In this case, the respective semi-floating potential regions can be contacted from both sides, which is not possible with straight embedding. With skewed embedding, first of all, semi-floating regions will become considerably shorter and, secondly, be independent of the absolute value of the overall embedding depth of the sensor and/or device and, thirdly, active cells at the potential of which they can be contacted are present on both sides. If the intersection angle of the skewed embedding relative to neighboring trenches is selected to be sufficiently great (further details will follow), the result will be the two-sided contacting described before. These three characteristics result in a reduction in the semi-floating potential region to a length of considerably less than 100 μm. Dynamically semi-floating potential regions for fast voltage pulses for example may be eased by embedding sensor structures in the field of cells of a power transistor as just described.

Generally, it will be of advantage to place the embedded structure as deep as possible into the power field-effect transistor. This will particularly be the case if the semiconductor structure embedded is a sensor which is to experience most equal physical conditions possible (like for example potential structure, temperature etc.) and thus has a characteristic curve which should, as far as possible, match that of the power field-effect transistor. When the contact area is arranged in an XV plane, it will be of advantage for skewed embedding to select the opening region such that a maximum difference of the X coordinates of the opening region and a maximum difference of the Y coordinates of the opening region be, if possible, of the same order of magnitude. This will exemplarily be the case if one of the following relations applies: $1/6 < \Delta Y/\Delta X < 6$ or $1/2 < \Delta Y/\Delta X < 3$ or if $\Delta Y$ matches $\Delta X$ up to a precision of 20%. Furthermore, it will be of advantage for the lead to the embedded sensor structure to be dimensioned such that, on the one hand, the sensor structure can be supplied with a sufficient amount of current, however, on the other hand, that the respective opening region in which the lead is located is kept as small as possible. This allows minimizing interferences of the power field-effect transistor by the sensor embedded in the best way possible.

The resulting elongate extension of the opening region may be described mathematically as follows. The opening region which is limited on the one hand by the contact area and, on the other hand, extends to a base line, the base line representing an edge of the contact area, has an area A and the edge of the opening region has a perimeter U. Using these, two geometrical quantities can be defined, namely, on the one hand, a first geometrical measure $V_1 = U/4$ and, on the other hand, a second geometrical measure which is defined by $V_2 = A/V_1$. A definition for an elongate extension here can be made as follows. The following applies for the first length $V_1$ and the second length $V_2$: $V_1 = \lambda V_2$, $\lambda > 1$. This relation applies for every rectangular shape of the opening region in case the length of one side of the rectangle is longer than the length of another side ($V_1$ and $V_2$, however, are not the lengths of the sides of a rectangle). The following would apply for a square: $\lambda = 1$, and, for a circle, $\lambda = U^2/(16 A) = \pi/4 < 1$. In case $\lambda > 4$, with a rectangular shape of the opening region, the length of one side would be at least 10 times greater than the other side.

In case the contact area has a rectangular shape, in further embodiments, the opening region spreads to a corner of the contact area, the corners being determined by maximum/minimum X,Y values for the contact area. In addition, the opening region may include a skewed part and a rectilinear part, wherein the skewed part may be characterized by the edge of the opening region intersecting the neighboring trenches in a certain angle, and the straight part may be characterized by the edge of the opening region being in parallel to a trench. The skewed portion of the opening region here may also be of a stepped shape, i.e., the edge of the opening region is either perpendicular or parallel to the trenches, wherein it is of advantage in this case for the step height and step width to be of the same order of magnitude and/or differ from each other by maximally 50%, or for the region which is perpendicular to the neighboring trenches to be longer than the region which is parallel to the neighboring trenches. With a stepped design of the opening region, however, it must be kept in mind that the region which is parallel to neighboring trenches be, exemplarily, of a length of at most 200 μm or at most 100 μm in order to avoid the error cases described before in semi-floating potential regions.

In further embodiments, the following relation applies for the angle and/or angle of inclination of a stepped design of the opening region: $\tan \alpha = n/m$, n being an integer multiple of a pitch distance in the X direction and M being an integer multiple of a pitch distance in the Y direction. A pitch distance in the X direction exemplarily matches a distance between two through-contactings to the body regions. On the other hand, the pitch distance in the Y direction may exemplarily be determined by a distance (and/or mean value) between two neighboring mesa stripes.

In further embodiments, the embedded sensor structure also includes another field-effect transistor which includes other source regions, and the other source regions exemplarily also include doped regions along the further mesa stripes. Furthermore, the other field-effect transistor includes other body regions, the other body regions being formed between the other source regions and drain region. The drain region of the power field-effect transistor may exemplarily match the drain region of the embedded field-effect transistor, which means that the two regions are for example at the same potential. In addition, the embedded field-effect transistor includes another gate region, the other gate region also being in electrical contact to the gate region of the power field-effect transistor so that, here too, the corresponding gate terminal (or control terminal) is at the same potential as the gate terminal of the power field-effect transistor. As has been described for the power field-effect transistor, when applying a corresponding voltage to the other gate region, channel regions form along a wall region of the trenches along which the embedded field-effect transistor is formed. These other channel regions allow a current to flow between the other source region and the drain region. Since for the embedded field-effect transistor, too, the further body regions are generally contacted by the other source regions, it is important for the other body regions to be electrically insulated from the body regions of the power field-effect transistor. This may be done by separating the body regions and the other body regions and by not forming body regions in a separation region. However, the consequence is that a thick oxide in the trench is of advantage in the region with no body. In the thick oxide trenches formed in this way, there are no source regions, i.e., the substrate extends to the surface and thus the drain potential is applied to these regions. When the oxide layer which separates the other gate regions from the trench wall is formed to a particular degree in the region of the thick oxide trenches, as has been mentioned, no electrical breakdown and/or damage to the oxide layer will occur due to the generally high potential difference between the drain region and the gate region. The fact that there are no body regions in the region of the thick oxide trenches prevents current from flowing and/or potential adaptation between the body regions and the other body region and also, due to the through-contacting of the body regions with the source regions, a short and/or an electrical current from flowing between the source regions and the other source region.

Embodiments thus are of advantage in that the semi-floating potential regions can be limited to a length which does not result in the device to be damaged. This is an advantage for fast switching devices where power field-effect transistors are frequently used and can increase both the reliability and lifetime thereof significantly. It is also to be mentioned that the design of the opening region does not necessarily relate to embedding a field-effect transistor or a sensor structure into a power field-effect transistor, but may also be applied wherever semi-floating regions in the sense described before occur.

Before the individual figures will be described subsequently, it is pointed out here that these illustrations are not to scale. In particular, no conclusions with regard to vertical dimensions can be drawn from the drawings with the embodiments of the terminal structures, nor can, with regard to lateral dimensions of the corresponding structures, conclusions be drawn as to specific dimensionings of implementations of the embodiments. The imaging ratios chosen in the figures are rather set with regard to clear representation and discussion of the embodiments. In the same way, no conclusions with regard to characteristic lengths of lateral structures may be drawn from the figures and especially small structures are frequently illustrated in an enlarged manner in order to describe the embodiments.

FIG. 1 is a schematic illustration of a design of an opening region 120 of a contact layer M1 for a semiconductor device formed in substrate 110 with a contact area M1. The semiconductor device is formed in a substrate 110 including a plurality of neighboring trenches $t_1, t_2, t_3, \ldots$. The substrate 110 may include other trenches which, however, cannot be seen in FIG. 1. A mesa stripe $m_1$ is located between two neighboring trenches, like for example between the trenches $t_1$ and $t_2$, and a mesa stripe $m_2$ is located between the trench $t_2$ and the neighboring trench $t_3$. This arrangement is continued over an entire field of cells, the field of cells including the entire semiconductor device. The semiconductor device is contacted via the contact area M1 which may exemplarily include a metal layer and also contact the mesa stripe $m_i$ (i=1, 2, 3, . . . ). In the embodiment illustrated here, the contact area M1 has a rectangular shape, i.e., it extends in an xy plane, which here is selected to be parallel to the contact area M1, from a value x=0 to a value $x=x_1$ and from a minimum Y value $y=y_1$ up to a maximum Y value $y=y_2$. Additionally, the contact area M1 includes an opening region 120, the opening region 120 extending from a base line 130 which coincides with an edge of the contact area M1 (for which x=0), at first along a skewed subregion 120*a* and then along a straight subregion 120*b*. The straight subregion 120*b* is characterized in that the edge, in the X direction of the straight subregion 120*b*, is parallel to one of the neighboring trenches $t_i$, and the skewed subregion 120*a* is characterized in that the edge of the skewed subregion 120*a* encloses an angle α relative to the neighboring trenches $t_i$.

The opening region 120 includes points in the xy plane the X values of which include an X region Δx and the Y values of which include a Y region Δy. Thus, two points of the opening region 120 in maximum distance to each other exemplarily differ in the Y coordinate by Δy and in the X coordinate by Δx. The skewed portion of the opening region 120a which correspondingly extends in a Δxa region and a Δya region exemplarily is implemented such that the ratio Δxa to Δya is between 0.1 and 20 or between 0.5 and 3. In the embodiment of FIG. 1, Δya=Δy, in another embodiment where the opening region has a skewed design (see, for example, FIGS. 2b and 2c) the two regions may differ. Alternatively, the skewed portion 120a of the opening region 120 is selected such that the angle α is between 30° and 60°. Although in FIG. 1 the skewed portion 120a has a rectilinear edge to the contact area M1, the edge may also have a stepped design, wherein in this case the angle α is defined such that it describes the angle between neighboring trenches $t_i$ and a straight, the straight corresponding to a mean increase of subsequent processes in the X direction.

In order to achieve two-side contacting, the angle α should be selected to be sufficiently great. This means that α>$α_{min}$ applies, the minimum angle $α_{min}$ corresponding to the case where just one trench is contacted on both sides of the skewed portion 120a. In this case, the following relation applies: sin $α_{min}$=b/d, b being the mean width of the opening region 120a and d indicating the embedding depth. In order for the opening region 120a to intersect as many trenches as possible, however, a should be considerably greater than $α_{min}$, exemplarily greater by a factor of 5. The condition that semi-floating regions be uncritical, described before, for the angle α means that the following relation applies: 90≧α>arcsin (b/$d_{crit}$), $d_{crit}$ being the critical length of semi-floating potential regions (exemplarily $d_{crit}$=100 μm).

It is also to be pointed out here that the angle α generally is not selected to be continuous, but may exemplarily only be altered in discrete processes. The discrete processes here are determined by the fact that when designing the opening region 120 it is of advantage for the contact area M1 only to be opened at certain positions. These certain positions may for example be the corresponding pitch distances, a pitch distance in the Y direction being determined by a mean distance of two neighboring trenches and a pitch distance in the X direction being exemplarily determined by a mean distance of two neighboring body through-contactings. The body through-contactings will be discussed in greater detail below, wherein it is only to be pointed out here that the body through-contactings may exemplarily be made at discrete positions on mesa stripes $m_i$ along the X direction. The pitch distances in the X and Y directions may exemplarily be in a range of 1 to 4 μm or roughly 2.75 μm.

Figure 2A:
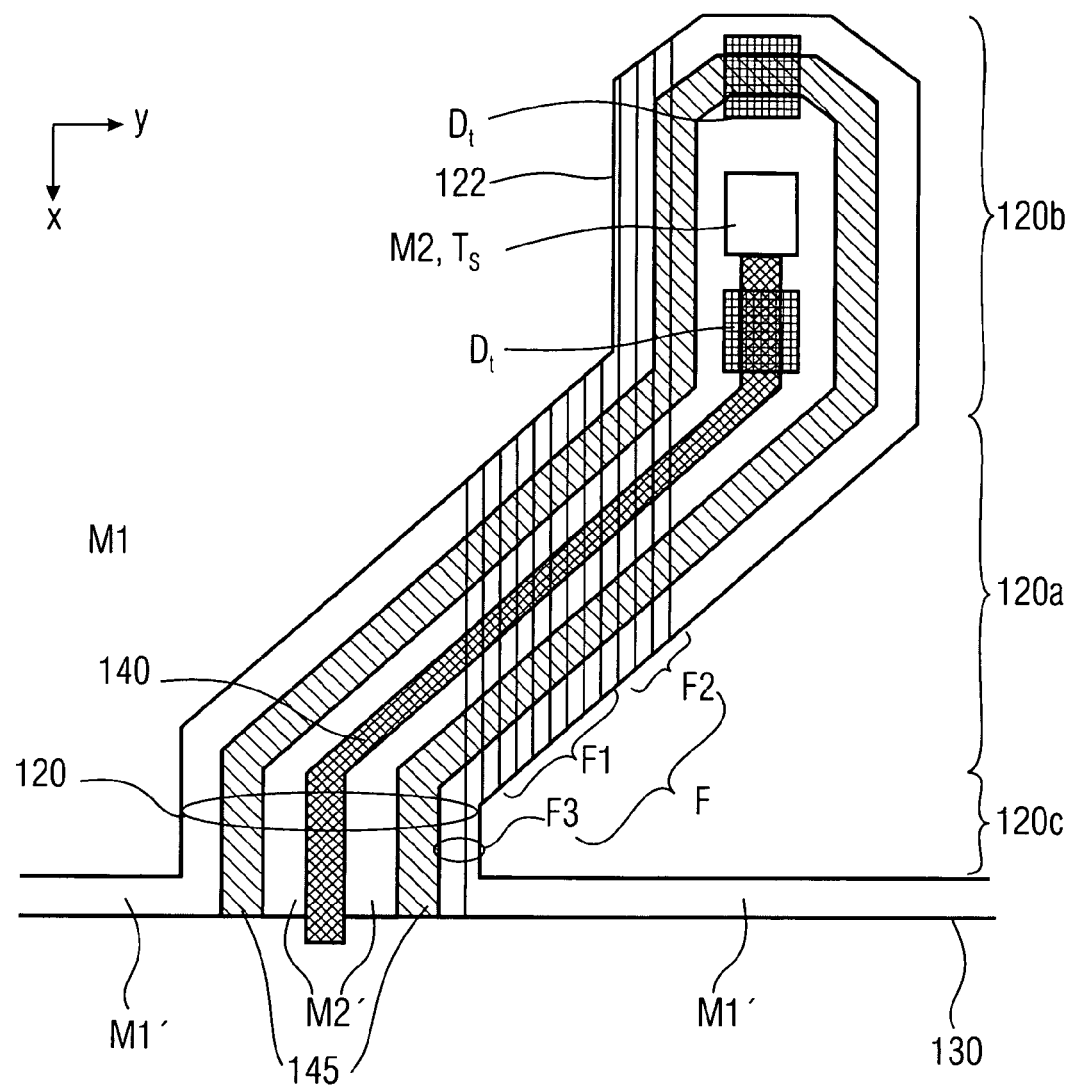
FIGS. 2*a* to 2*c* show schematic illustrations of an embedded sensor structure in the semiconductor device having semi-floating potential regions according to embodiments.

FIG. 2a illustrates an example of how a device may be embedded in the opening region 120. The contact area M1 extending along the xy plane and being limited along the X direction by the base line 130 is illustrated again, the base line 130 corresponding to a maximum X value of the contact area M1. The contact area M1 in turn has an opening region 120 which is divided into a skewed opening region 120a and a straight opening region 120b, the straight opening region including a boundary line 122 which is parallel to a mesa stripe $m_i$ and intersects at most five mesa stripes $m_i$. In addition to the embodiment illustrated in FIG. 1, the opening region 120 in FIG. 2a has another straight opening region 120c, the other straight opening region 120c extending between the skewed opening region 120a and the base line 130. Another contact area M2 is formed within the opening region, the other contact area M2 extending from the base line 130 into the opening region 120. The straight opening region 120b has an embedded device which in the embodiment illustrated here is a transistor $T_s$. The embedded transistor $T_s$ is contacted electrically by a lead 140, the lead 140 extending along the opening region 120 from the embedded transistor $T_s$ to the base line 130. The contact area M1 and the other contact area M2 are electrically insulated, wherein in the embodiment of FIG. 2a an insulating intermediate region 145 is arranged in the gap between the contact area M1 and the other contact area M2.

As will be illustrated in greater detail below, the insulating intermediate region 145 may be implemented as an oxide layer and extend partly between the metal layer M1 and the substrate 110 and also partly between the other contact area M2 and the substrate 110. The result in the transition region thus are a first and second intermediate regions M1' and M2' where the contact areas M1 and M2 are separated from the substrate 110 by the insulating intermediate region 145. If the insulating intermediate region 145 is not implemented as a layer, the regions M1' and M2' will be part of the contact areas M1 and M2. Since the embedded transistor $T_s$ can also use the trench structure which in this level of drawing is below same (not illustrated in the figure), it is necessary for the corresponding body regions of the embedded transistor $T_s$ to be electrically insulated. Like described before, this may exemplarily be done by not forming body regions in an intermediate region, wherein it may be of advantage in this intermediate region to form a thick oxide layer in the trench (thick oxide layers $D_t$). Before discussing a specific realization of the embedded transistor $T_s$ in a field of cells of a power transistor in the following figures, the semi-floating potential regions F are first to be characterized in greater detail.

The semi-floating potential regions F can be divided into short semi-floating potential regions F1 and long semi-floating potential regions F2 and are illustrated in FIG. 2a by perpendicular thin lines. The semi-floating potential regions F extend to regions where the mesa stripes $m_i$ are not contacted by the contact area M1. This is, for example, the case in the opening region 120 and/or when the insulating intermediate region 145 is formed between the contact area M1 and the substrate 110. Depending on the geometry of the opening region 120, the semi-floating potential regions F may include different lengths. The short semi-floating potential regions F1 will result along the skewed opening region 120a and the long semi-floating potential regions F2 along the straight opening region 120b and extend partly along the skewed opening region 120a. Both semi-floating potential regions F1 and F2 in this embodiment are contacted from both sides by the contact area M1 which performs potential equalization at this position. The semi-floating potential regions F may exemplarily include body regions or source regions of the underlying trench structure (see below).

In addition to the semi-floating potential regions F which are contacted from both sides, there may be potential regions which are contacted electrically by the contact area M1 only on one side. However, in one embodiment, these additional semi-floating potential regions F3 are shorter than the long semi-floating potential regions F2. With great overall embedding depths of the exemplarily embedded transistor $T_s$, the short semi-floating potential regions F1 may be duplicated multiply, i.e., the number thereof may be considerable. On the other hand, a number of long semi-floating potential regions F2 including a greatest length but being double-contacted is limited by a lateral extension of the insulating intermediate region 145 along the Y direction next to the embedded transistor $T_s$. The length of the long semi-floating potential regions F2 may exemplarily be in a range from 110 μm to 150 μm or be 130 μm and the length of the short semi-floating potential regions F1 may exemplarily be in a range from 50 to 100 μm or exemplarily have a value of roughly 75 μm.

However, since both the short semi-floating potential regions F1 and the long semi-floating potential regions F2 are each contacted on two sides, an effective length of the semi-floating potential region F will correspond to half of the value indicated. Thus, the semi-floating potential regions F are uncritical with regard to simulations of possible error cases which, like described before, had the result that semi-floating potential regions of a length of less than 100 μm generally are uncritical. Metals may exemplarily be used as the material for the contact area M1 and for the other contact area M2 and the lead 140.

Figure 2B:
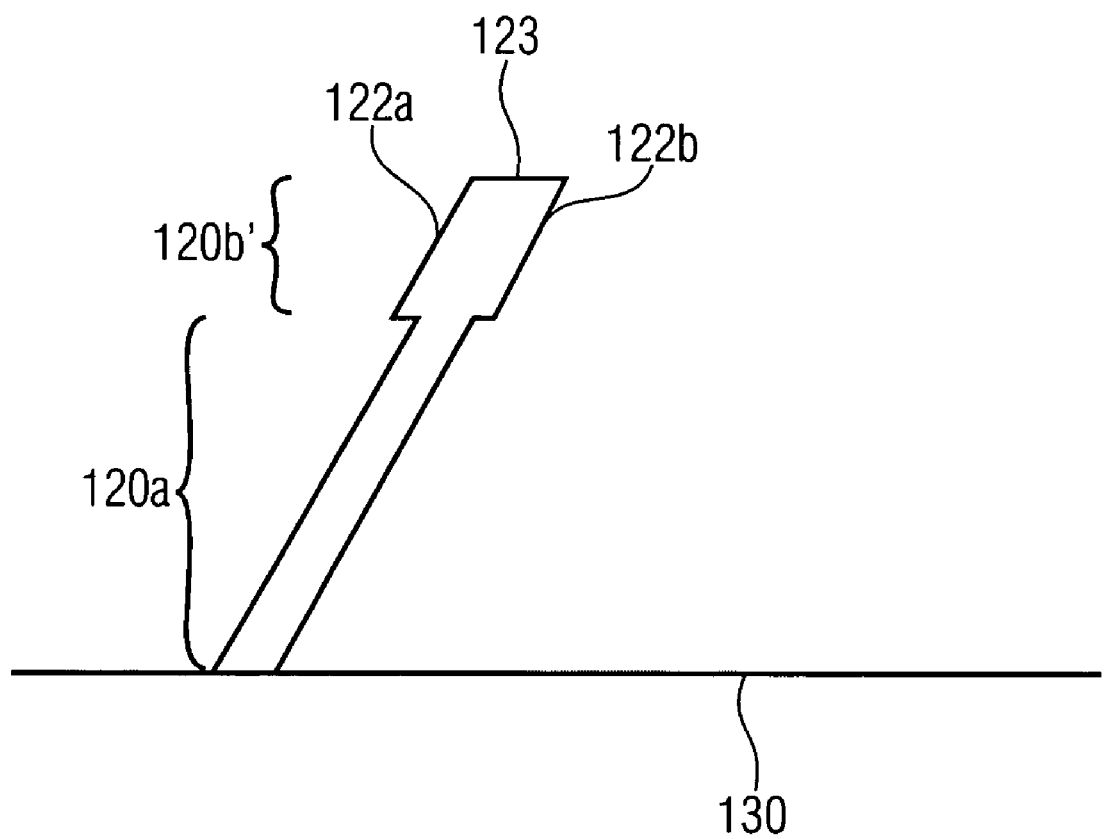
Figure 2C:
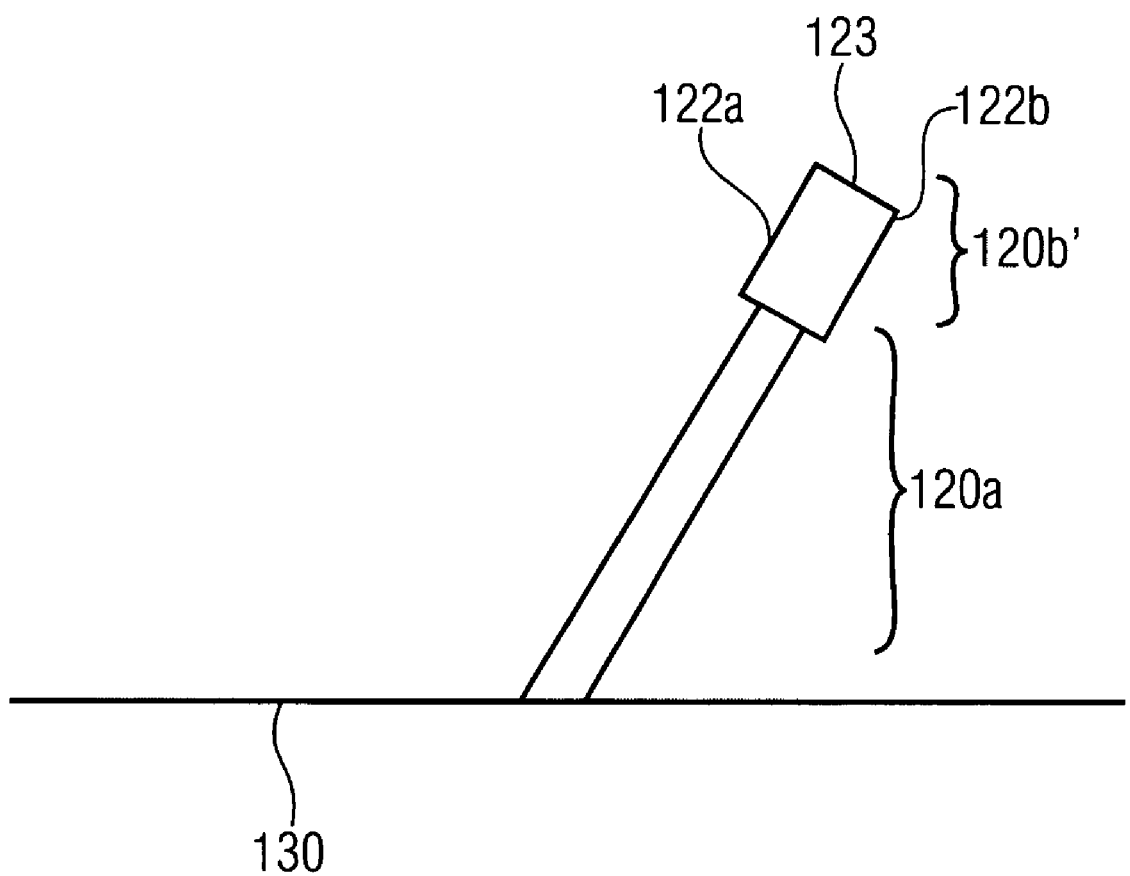

Two further embodiments which only differ from the case illustrated in FIG. 2a in that the straight opening region 120b has been replaced by another skewed opening region 120b' are illustrated in FIGS. 2b and 2c, so that the boundary line 122 is also in a skewed relation to the mesa stripes $m_i$ and can intersect at least one, but also more than 100 (exemplarily several 100 up to 1000) mesa stripes $m_i$. In the embodiment of FIG. 2b, the other skewed opening region 120b' has two skewed boundary lines 122a and 122b which are connected by a connection line 123 which is perpendicular to the mesa stripes $m_i$. In the embodiment illustrated in FIG. 2c, the connection line 123 is also in a skewed relation to the mesa stripes $m_i$.

Figure 3:
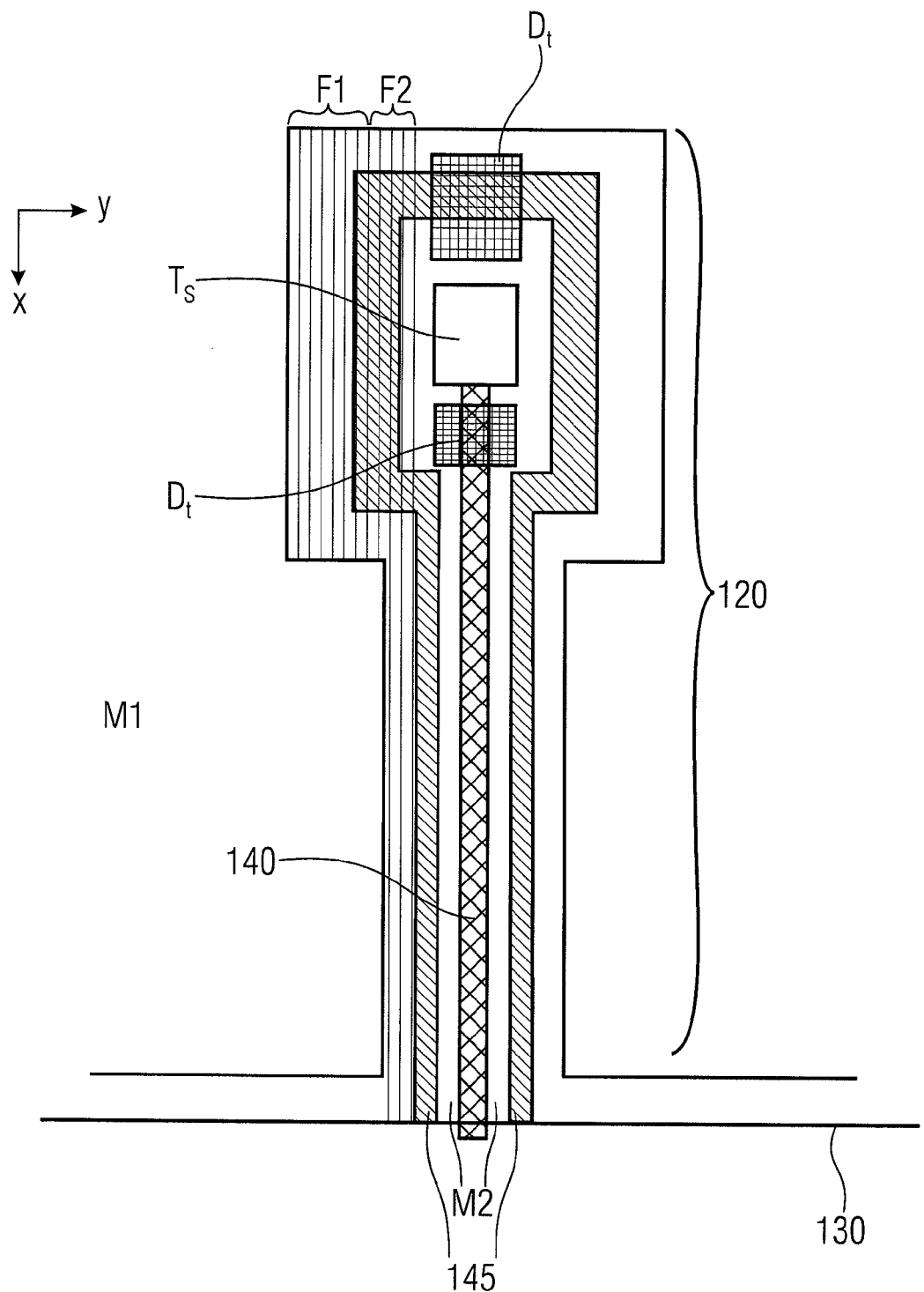
FIG. 3 is a schematic illustration of a conventional embedding of a semiconductor structure in the semiconductor device having semi-floating potential regions.

FIG. 3 illustrates a conventional design of the opening region 120 in a contact area M1. As can be seen, the opening region 120 is oriented along the X direction and, compared to one embodiment, as is exemplarily illustrated in FIGS. 2a-2c, does not include a skewed opening region 120a. FIG. 3 again illustrates an embedded transistor $T_s$ which is connected to the base line 130 via the lead 140 contacting the embedded transistor $T_s$. In addition, the insulating intermediate region 145 is implemented so as to electrically insulate the contact area M1 from the other contact area M2. In order to insulate the embedded transistor $T_s$ and/or the body regions thereof correspondingly, it may be necessary (as described before) to form a thick oxide and/or the oxide regions $D_t$ in the trench.

The result of designing the opening region 120 or, more precisely, the edge of the opening region 120 in parallel to the X direction and thus in parallel to the neighboring trenches $t_i$ is that the corresponding semi-floating potential regions F are considerably longer. There are short semi-floating potential regions F1 which are contacted on both sides by the contact area M1 and the length of which is uncritical, however it cannot be avoided with this kind of embedding that, in addition to the short semi-floating potential regions F1, further long semi-floating potential regions F2 result, the length of which in this conventional design of the opening region 120 corresponds to the embedding depth. This means that the length of the long semi-floating potential regions F2 corresponds to the extension of the opening region 120 along the X direction into the contact area M1.

Since the embedding depth generally is selected to be very large in order to provide, as has been mentioned, optimum surroundings for the embedded transistor $T_s$ (like for example a homogeneous potential region, equal temperature etc.), the long semi-floating potential regions F2 are also very long. The long semi-floating potential regions F2 may exemplarily include a length of 220 μm and the short semi-floating potential regions F1 may exemplarily include a length of 140 μm. Since the short semi-floating potential regions F1 are contacted on both sides, however, the result is an effective length of roughly 70 μm. Correspondingly, the short semi-floating potential regions F1 in this conventional design are uncritical, however, the unavoidably occurring long semi-floating potential regions F2 include a length which is clearly above the uncritical length. As has already been described, semi-floating potential regions F are critical starting from a length of roughly 100 μm. Since the long semi-floating potential regions F2 are only connected on one side (top), they are semi-floating in the bottom part (and exemplarily include body regions formed in mesa stripes $m_i$). Depending on the embedding depth of the current sensor, the result here may be lengths of considerably more than 220 μm. Exemplarily, embeddings of roughly 1 mm are possible so that the length of the long semi-floating potential regions F2 would also be 1 mm. However, this is unacceptable, in particular when there are fast transient processes (like for example in the form of ESD or ISO pulses).

Figure 4:
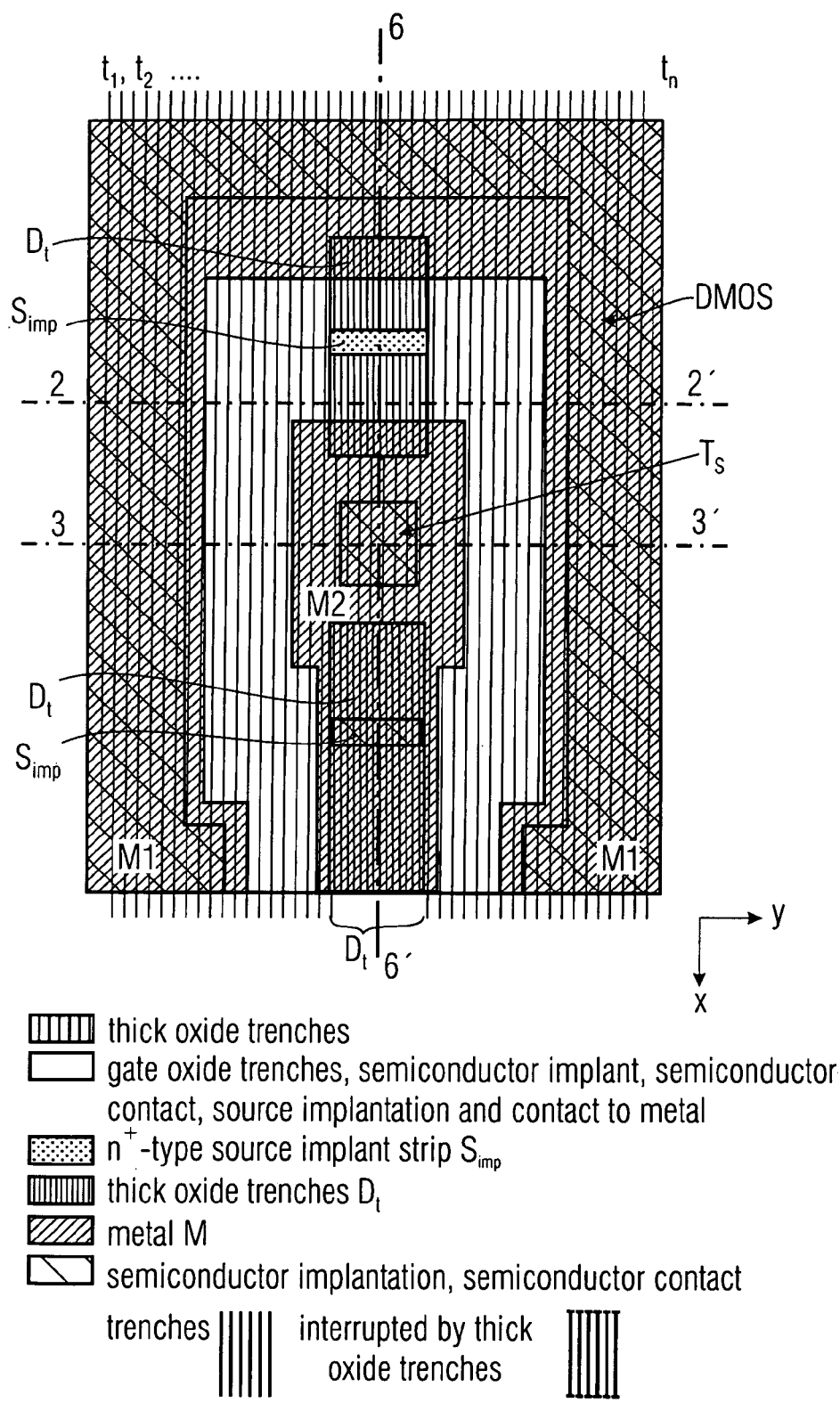
FIG. 4 illustrates a schematic layout view of an embedding of a field-effect transistor in the field of cells of a power field-effect transistor.

FIG. 4 illustrates a more detailed description of the straight opening region 120b, the opening region 120b being embedded in an integrated power field-effect transistor. The power field-effect transistor includes gate oxide trenches $t_1, t_2, \ldots,$ tn illustrated as thin lines in the X direction, which in the drawing is in the direction from the top to the bottom. The thick oxide trenches $D_t$ serving for limiting and insulating the sensor transistor $T_s$ illustrated in the center of FIG. 4 are also in the X direction, but are, for improved emphasizing purpose, indicated as thicker lines. The areas with skewed hatching are metal areas M1 and M2. The entire region illustrated, except for the portions with the thick oxide trenches $D_t$ illustrated in thicker lines and the source implantation Simp discussed below, represents a body implantation (body region formed) and body contacts, which will become more obvious below referring to the sectional views of FIGS. 5-7.

The layout illustrated in FIG. 4 keeps homogeneity interference low by using (as far as possible, see farther below) a continuous gate oxide region, i.e., the gate oxide trenches $t_1$, $t_2$, tn are continuous except for the small-area regions of the thick oxide trenches $D_t$. A CMP (chemical mechanical polishing) process which exemplarily follows later in the process flow will see relatively homogenous conditions in the surroundings of the sensor transistor $T_s$, resulting in a more uniform layer removal. The implantation of the body regions and the body contacts is, as far as possible, also formed over the entire area in order to provide more uniform potential conditions.

Additionally, it can be seen in FIG. 4 that exemplarily an $n^+$-doped source implant stripe Simp is above and below the embedded transistor and/or sensor transistor $T_s$ in the X direction to suppress a potential parasitic MOS transistor on the surface (exemplarily p-channel on the surface of the $n^-$-doped silicon between the two p-body regions of the power transistor and load transistor DMOS (double-diffused metal oxide semiconductor), respectively, and sensor transistor $T_s$ and/or between the sensor transistor $T_s$ and other p-regions on the chip).

The characteristics of the integrated MOS power switch discussed so far, like for example of the power field-effect transistor, as have been discussed before referring to the layout illustration in FIG. 1, will become more obvious using the schematic cross-sectional illustrations illustrated in FIGS. 5 to 7 below.

Figure 5:
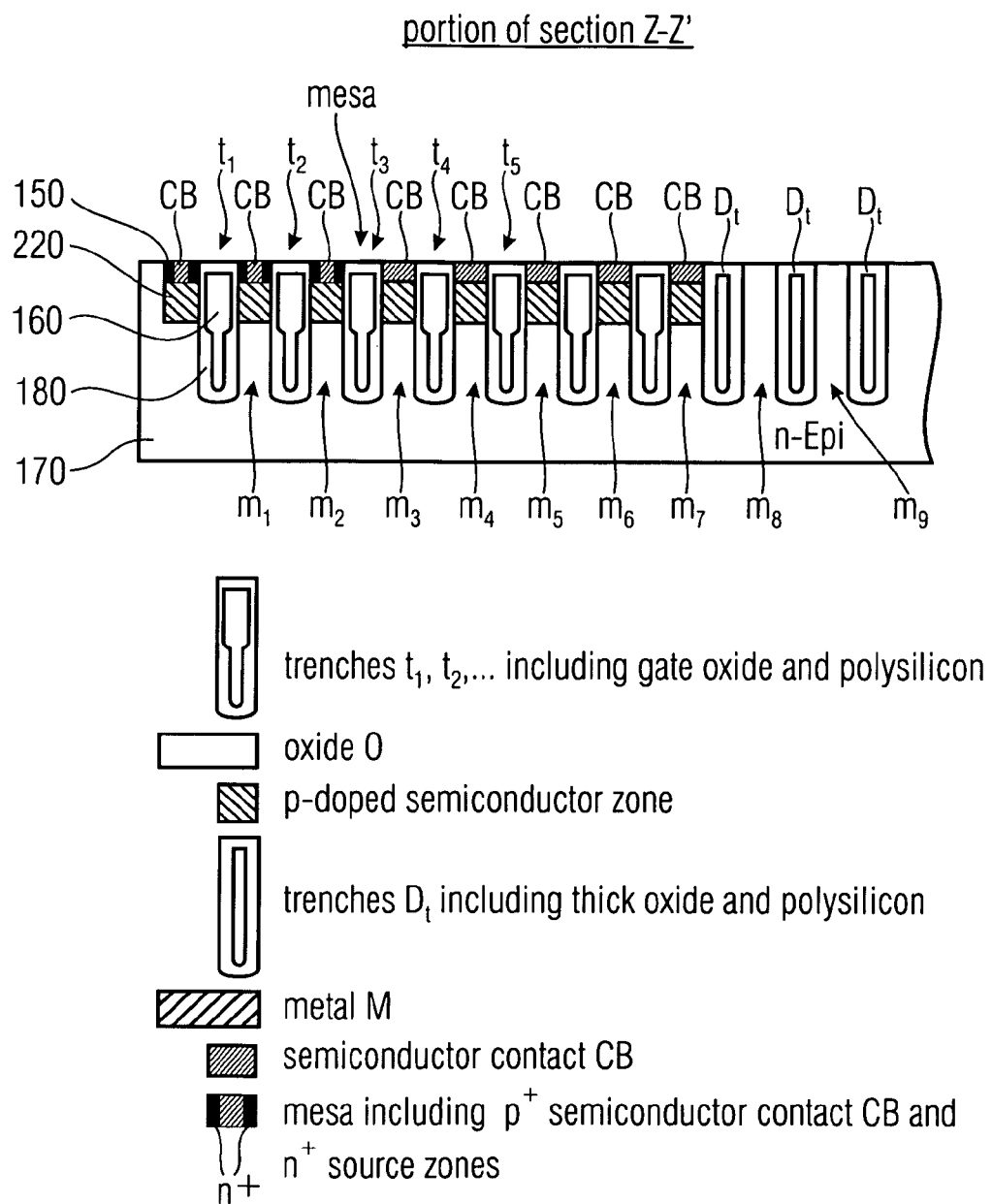
FIG. 5 is an enlarged illustration of a section of a cross-sectional illustration of FIG. 4 along the intersection line 2-2'.

FIG. 5 illustrates a cross-sectional view of FIG. 4 along the intersection line 2-2', wherein only the left subregion is illustrated in an enlarged manner. Trenches $t_i$ with the mesa stripes $m_i$ therebetween are arranged in the substrate 110 (which is implemented here as an n-epitaxial layer). The source regions 150 are formed along the mesa stripes $m_i$ and the gate regions 160 are formed in the trenches $t_i$. The drain region 170 is formed on that side of the substrate 110 facing away from the trenches. The gate regions 160 are insulated from the substrate 110 and from the body regions 220 by the gate oxide

180. The body regions 220 are formed between the drain region 170 and the source regions 150 or the body through-contactings CB.

In FIG. 5, the source regions 150 which in this embodiment include n⁺-doped regions are formed only on the left side (exemplarily along the mesa stripes $m_1$ and $m_2$) which corresponds to the region below the contact area M1 along the cross section 2-2'. No source regions 150 are formed along the mesa stripes $m_3$ to $m_7$, but only body through-contactings CB, wherein this region correspond to the region below the insulating intermediate region 145. The body through-contactings CB may exemplarily be implemented by p⁺-doped regions. Thick oxide trenches $D_t$ are formed on the right side of FIG. 5 (along the mesa stripes $m_8$ and $m_9$), so that this region corresponds to the region in the center of the cross section 2-2' of FIG. 4. The thick oxide trenches $D_t$ do not include body regions 220 or source regions 150 so that the substrate 110 (the exemplarily n-epi layer) fills the entire mesa stripes $m_8$ and $m_9$. At the same time, the oxide layer 180 within the trenches has greater a thickness at this position in order to prevent breakdown (as discussed before).

Figure 6:
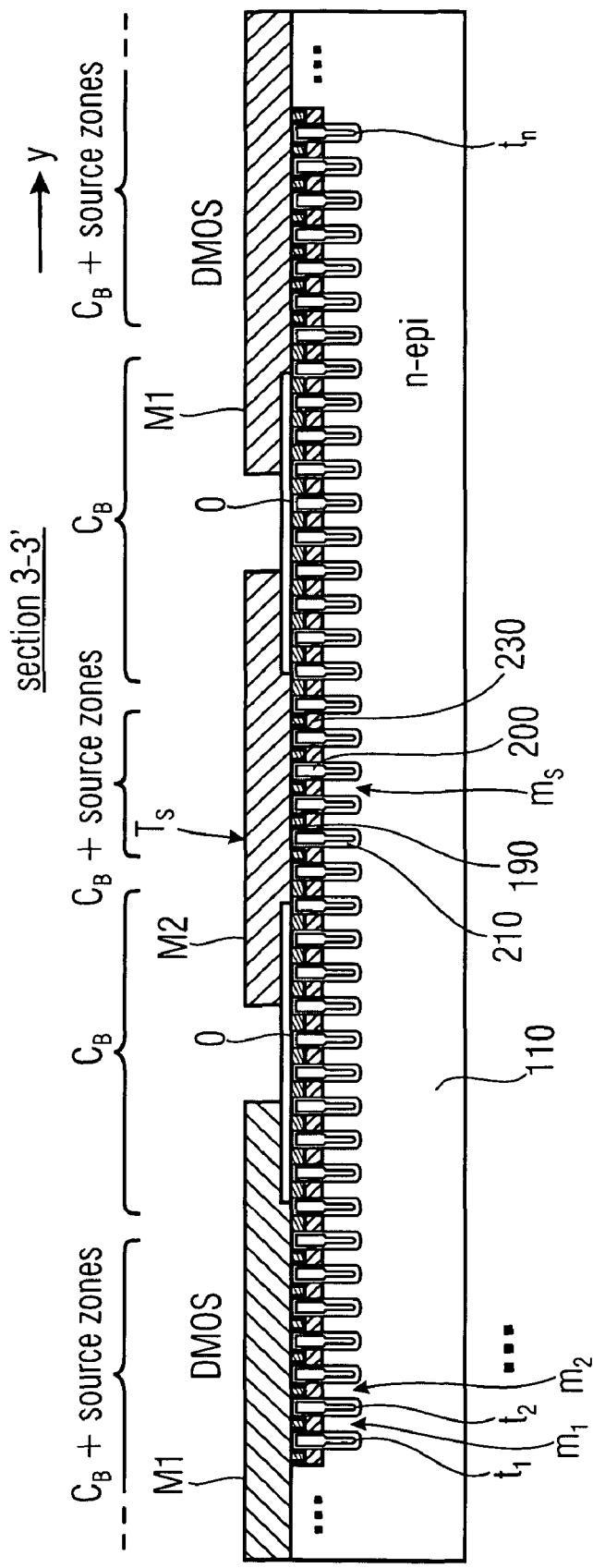
FIG. 6 is a schematic cross-sectional illustration through the power field-effect transistor of FIG. 4 along the intersection line 3-3'.

FIG. 6 illustrates a cross-sectional illustration in the Y direction along the intersectional line 3-3' of the layout of FIG. 4. The cross-sectional view clearly illustrates that the trenches forming the field of cells of the sensor transistor $T_s$ structurally match the trenches t1, t2, ... of the field of cells of the load transistor DMOS in their geometry, regular sequence and setup on both sides (in the Y direction) of the sensor transistor $T_s$. The sensor transistor $T_s$ is formed along other mesa stripes $m_s$, the other mesa stripes $m_s$ including other source regions 190, other gate regions and other body regions 230 and the sensor transistor $T_s$ being separated from the load transistor (in the cross-sectional illustration of FIG. 6) by oxide layers O. In the embodiment of FIG. 6, the p-doped body implantations 220, 230 are also formed over the entire area along the section illustrated in the Y direction. Similar facts apply for the implantation of the body contact CB which fills the entire width of the mesa $m_i$ between the trenches $t_i$ below the oxide layers O (which represent an example of the insulating intermediate region 145) and which outside the oxide layers O is in the center of the mesa $m_i$ between two n⁺-doped source regions 150. As a precautionary measure, on the left- and right-hand sides outside the oxide layers O, a respective mesa $m_i$ is filled with the body 220 and the body contact CB over its entire width (an inactive mesa), the mesa $m_i$ being contacted directly with the source potential of the respective transistor (load DMOS and/or sensor DMOS), but which may also be omitted under certain circumstances. Like in FIG. 4, in FIG. 6, too, the remaining part of the DMOS load transistor is omitted in order to be able to illustrate details in the region of the sensor transistor $T_s$ better. The layout view in FIG. 4 and the sectional view 3-3 of FIG. 6 illustrate the embodiment on the basis of conventional metal design rules for power switches. However, this is not to be limiting, but the semiconductor device may also be realized using stricter design rules. In particular, the distance between active regions of the load DMOS and sensor DMOS may also be reduced in favor of improved embedding, since in this case a reduced number of non-contacted mesas $m_i$ will be necessary.

Figure 7:
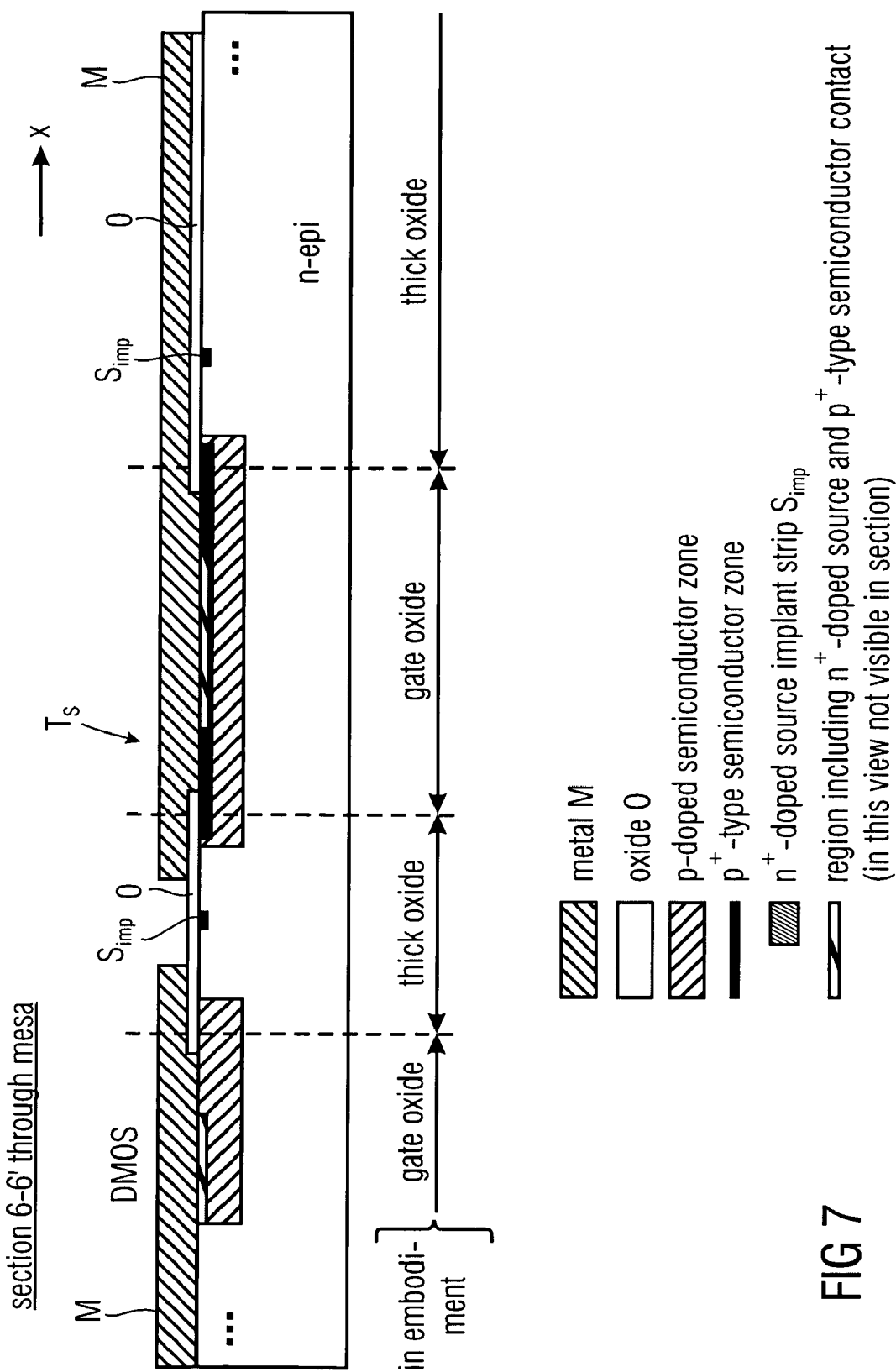
FIG. 7 illustrates a schematic sectional view through a mesa of FIG. 4 along the intersection line 6-6'.

FIG. 7 is a sectional illustration along the intersection line 6-6'. The n⁺-doped source implant stripes Simp already discussed referring to FIG. 4 can be seen below a respective oxide layer O above and below the sensor transistor $T_s$. The p-doped body zone 220 and, above it, the p⁺-body contact CB and a region including an n⁺-doped source 150 and a p⁺-doped body contact CB can be seen in the region of the sensor transistor $T_s$ and in the left illustrated portion of the load DMOS (in this view not visible in section). In addition, the portions present in the integrated MOS power switch and the transition from and/or between gate-oxide trenches $t_i$ and thick oxide trenches $D_t$ are also indicated in the bottom part of FIG. 7, i.e., below the n-epi layer.

The dopings illustrated in FIGS. 4 to 7 are only examples. Corresponding complementary dopings for the individual regions of the substrate 110 or a correspondingly stronger or weaker doping may be present in further embodiments.

Figure 8:
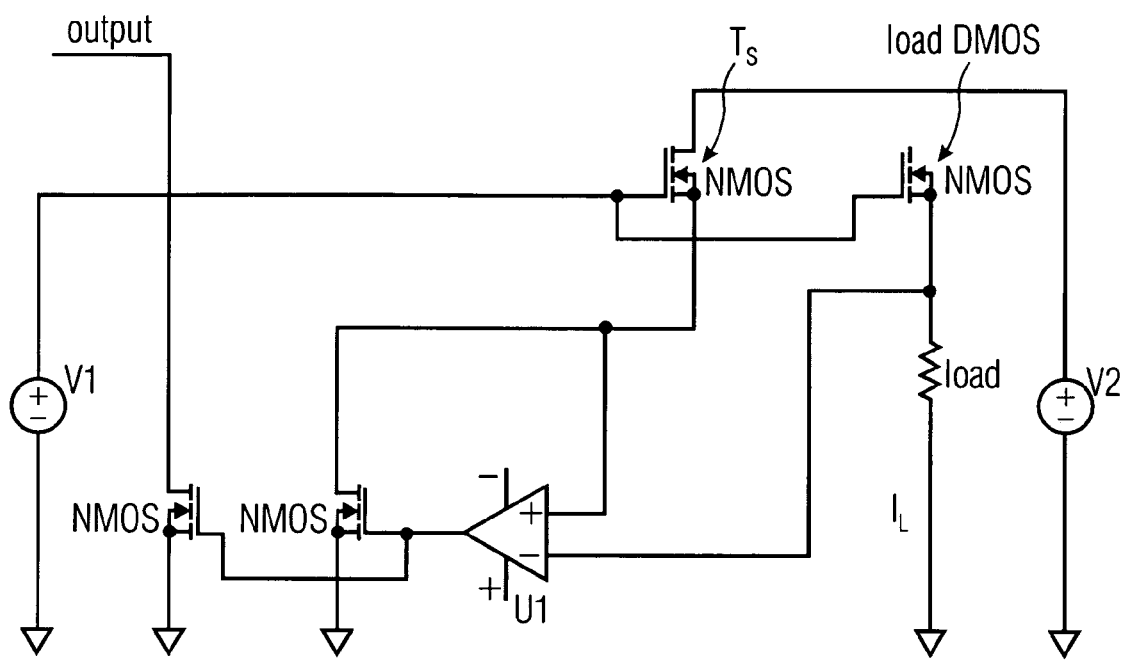
FIG. 8 illustrates a circuit diagram of an integrated power transistor the load transistor and sensor transistor of which are each realized as N-DMOS transistors.

FIG. 8 illustrates a schematic switching example of an MOS power switch equipped with a current sensor in high-side applications the MOS transistors of which are N-DMOS transistors. Among other things, a current sensor is usually integrated on the power switch chip in order to realize self-protecting MOS power switches.

In one common embodiment, the current sensor is realized as a small DMOS sensor transistor $T_s$ which provides a current proportional to the load current $I_L$ flowing through the load DMOS transistor, provided it is wired to an identical voltage like the load DMOS. This DMOS sensor transistor $T_s$ is, for example, smaller by a factor of 1,000 to 100,000 than the load DMOS, and the current through it is a sensor current which ideally is smaller by the geometrical ratio of the active areas of the two transistors, namely the load DMOS and the sensor transistor $T_s$, than the load current $I_L$ through the load DMOS. This ratio will subsequently be referred to as the ideal ratio $K_G$ of the currents, in contrast to the real ratio K of the currents.

When the integrated MOS power switch, as is illustrated in FIG. 8, is realized in common-drain technology, both transistors, i.e., the load DMOS and the sensor transistor $T_s$, have the same drain potential and the same gate potential. The source potential of the load DMOS is tapped, as is exemplarily illustrated in FIG. 8, and the source potential of the sensor transistor $T_s$ is regulated to the same potential. De facto, the real ratio K of the currents represents the quotient of the on resistances of the sensor transistor $T_s$ and load DMOS.

In a practical implementation, with small a load current, the load DMOS and sensor transistor $T_s$ are operated at smaller a gate-source voltage since, with high gate-source voltages, the voltage drop across the load DMOS would be small and correspondingly the offset voltage of the differential amplifier U1 would influence the current measurement precision more strongly. Under these conditions, the load DMOS and sensor transistor $T_s$ are operated at a gate-source voltage which is close to the starting voltage and thus operated at an operating point wherein the channel resistance dominates the on resistance of the DMOS transistors. A difference in the starting voltage of the two transistors, load DMOS and sensor transistor $T_s$, in this operating point results in great deviations of the real current ratio K from the ideal geometrical ratio Kg.

Two operating modes have been realized in practice:

On the one hand, operation at high a gate-source voltage even with small load currents. Good matching of the on resistance $R_{ON}$ is important here. The current measurement precision here is limited by the offset of the downstream differential amplifier (see FIG. 8).

On the other hand, operation at low a gate-source voltage with small load currents. Good matching of the starting voltages $V_{ES}$ of the load DMOS and the sensor transistor is important here since this matching limits the current measurement precision. With great load currents (and great a gate-source voltage), matching of the on resistance $R_{ON}$ is again important.

In order to achieve high precision of the current sensor under different operating conditions, the load DMOS and sensor transistor $T_s$ have to exhibit good matching. Matching here means matching of the characteristic curves and equal starting voltages of the two transistors. Furthermore, the sensor transistor should be embedded into the active region of the load DMOS in the best manner possible in order to achieve the most homogeneous current density possible in the surroundings of the sensor transistor $T_s$ and thus comparable voltage drops, for example in the substrate 110 of the integrated MOS power switch.

Another embodiment for embedding the sensor transistor $T_s$ is achieving (in the ideal case) equal temperatures in both transistors. This means that, when the load transistor DMOS heats up in the operating state, the sensor transistor $T_s$ should heat up equally. In conventional integrated MOS power switches, the distance from the load DMOS to the sensor transistor is relatively great in order to take design rules in effect in conventional technologies (metal pitch, metal overlap) into consideration. In order to realize embedding of the sensor transistor in the best way possible, the distances between the sensor transistor and the load DMOS transistor have to be minimized.

The embedding of the sensor transistor $T_s$ is influenced considerably by the design of the opening region 120. The design may be such that a sufficiently great embedding depth d can be achieved with the smallest possible loss in active area. This means that, on the one hand, the embedded sensor structure reaches a sufficiently great embedding depth d, however a corresponding lead should consume as little area of the contact area M1 as possible. Thus, the width of the elongate opening region 120 should be as small as possible. However, it should be ensured that there is sufficient dimensioning so that low-resistance current feeding to the embedded semiconductor structure, like for example the sensor transistor $T_s$, will be possible. The sufficiently great embedding depth d should at the same time be accompanied by a limited length of the semi-floating potential regions F, exemplarily the semi-floating potential regions F should not be longer than 100 μm (or at most 200 μm with two-side contacting).

Embodiments thus exemplarily relate to contacting a sensor structure which is embedded in a power field-effect transistor, wherein the leads (at least partly) are not designed to be perpendicular and/or parallel to the field of cells edges/chip edges/trench stripe direction, but are arranged in a skewed relation thereto. Thus, semi-floating potential regions in the region of the leads are wired (contacted) to active cells on both sides. The active cells here correspond to the regions which are contacted by the contact area M1. Sensor embedding here, as mentioned, takes place in a skewed manner, i.e., the position of the sensor center is laterally offset to the position of the position where the lead enters into the field of cells region and/or the leads form one (or several) angles of greater than 10° and smaller than 90° with the field of cells/chip edges. The entering position of the leads here is that position on the base line 130 where the opening region 120 meets the base line 130. The angles of the leads here exemplarily correlate to integer multiples of the pitch distances of the field of cells in the X and Y directions.

It is also to be mentioned that in other embodiments the embedded current sensor and/or embedded field-effect transistor may be replaced by all kinds or structures to be embedded which, as a consequence of embedding, contain semi-floating regions. Embodiments also relate to a corresponding method of contacting a semiconductor device having the shape of the opening region 120 of the contact area M1 described before.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device comprising:
   a substrate comprising a plurality of neighboring trenches and one or more mesa stripes, wherein each mesa stripe from the one or more mesa stripes is formed between two neighboring trenches; and
   a contact area contacting the one or more mesa stripes, the contact area surrounding an opening region in which no contact area is formed and which is shaped such that the contact area contacts at least one mesa stripe of the one or more mesa stripes at two positions between which the opening region is arranged, and the opening region comprising a region of elongate extension which intersects the one or more mesa stripes in a skewed or perpendicular manner.

2. The semiconductor device of claim 1, wherein the contact area is in an xy plane comprising X values and Y values and the neighboring trenches extend along an X direction, an extension of the opening region in the Y direction being at least 10% of an extension of the opening region in the X direction.

3. The semiconductor device of claim 2, wherein the extension in the X direction equals the extension in the Y direction within a tolerance range of +/−20%.

4. The semiconductor device of claim 2, wherein the extension of the opening region in the X direction ($\Delta x$) and the extension of the opening region in the Y direction ($\Delta y$) are defined such that the following applies: $\frac{1}{2} < \Delta y / \Delta x < 3$.

5. The semiconductor device of claim 2, wherein the opening region is provided with an edge by the contact area and the base line so that x=0 applies for the base line, the base line forming an edge of the contact area of maximum X values and the opening region comprising a perimeter U and an area A, a first geometrical measure being defined by $V_1 = U/4$ and a second geometrical measure being defined by $V_2 = A/V_1$, wherein the following relation applies: $V_1 > V_2$.

6. The semiconductor device of claim 1, wherein the opening region additionally comprises an edge region, the edge region abutting on the contact area and on the region of the elongate extension and being, with a boundary line, parallel to one of the one or more mesa stripes and intersecting, with the boundary line, at most five mesa stripes.

7. The semiconductor device of claim 1, wherein the opening region additionally comprises an edge region, the edge region abutting on the contact area and on the region of the elongate extension and comprising skewed boundary lines and a connection line, the connection line connecting the skewed boundary lines, and the connection line and the skewed boundary lines intersecting the one or more mesa stripes, the one or more mesa stripes including a value between 1 and 1000.

8. The semiconductor device of claim 1, wherein the region of the elongate extension is formed such that it intersects the one or more mesa stripes in an angle α so that the following applies: tan α=n/m, n being an integer multiple of a pitch distance in a perpendicular direction to the neighboring trenches and m being an integer multiple of a pitch distance in a parallel direction to the neighboring trenches, the pitch distance in the perpendicular direction corresponding to a distance of two of the neighboring trenches and the pitch distance in the parallel direction corresponding to a distance of two contacts spaced in a trench direction to one of the one or more mesa stripes.

9. The semiconductor device of claim 1, wherein the contact area ends in a corner region along a base line and part of the opening region is arranged in the corner region.

10. The semiconductor device of claim 1, wherein another contact area which contacts the one or more mesa stripes or further mesa stripes not included in the one or more mesa stripes is formed within the opening region and the other contact area is electrically insulated from the contact area.

11. The semiconductor device of claim 10, wherein the opening region comprises an embedded semiconductor structure and the embedded semiconductor structure is contacted electrically by the other contact area, and at least one lead and wherein the lead comprises an electrical contact to the embedded semiconductor structure and is coupleable electrically.

12. The semiconductor device of claim 11, wherein the embedded semiconductor structure comprises a field-effect transistor,
wherein the other contact area forms another source terminal,
and wherein doped regions along the one or more mesa stripes or the further mesa stripes form another source region so that the other contact area contacts the other source region and another insulation region is formed between the other source region and the source region,
and wherein a drain electrode is formed on a side of the substrate facing away from the other contact area,
and wherein another gate region is formed within the neighboring trenches or within other trenches between the further mesa stripes, the other gate region comprising another insulation to the substrate and the other contact area.

13. The semiconductor device of claim 1, wherein the contact area forms a source terminal for a power field-effect transistor and the power field-effect transistor comprises a source region, a gate region and a drain region,
wherein the source region is formed by doped regions along the one or more mesa stripes and is in electrical contact to the contact area,
and wherein the drain region is formed on a side of the substrate facing away from the contact area,
and wherein the gate region is formed within the neighboring trenches, the gate region comprising an electrical insulation to the substrate.

14. A semiconductor sensor structure including a power field-effect transistor comprising a source region, a gate region and a drain region, and another field-effect transistor comprising another source region and another gate region, comprising:
a substrate comprising a plurality of neighboring trenches and one or more mesa stripes, wherein each mesa stripe from the one or more mesa stripes is formed between two neighboring trenches, doped regions of the one or more mesa stripe forming the source region and other doped regions of the one or more mesa stripe or a further mesa stripe not included in the one or more mesa stripe forming the other source region;
a contact area contacting the source region, the contact area surrounding an opening region in which no contact area is formed and which is shaped such that the contact area contacts the one or more mesa stripes at two positions between which the opening region is arranged, and the opening region comprising a region of elongate extension which intersects the one or more mesa stripes in a skewed or perpendicular manner; and
another contact area extending in the opening region, comprising an electrical contact to the other source region and being electrically insulated from the contact area,
and wherein the drain region is formed on that side of the substrate facing away from the contact area and includes a drain terminal for the power field-effect transistor and the other field-effect transistor,
and wherein the gate region is formed within trenches between the one or more mesa stripes and the other gate region is formed within the trenches or within other trenches between the further mesa stripes and comprises another electrical insulation to the substrate.

15. The semiconductor sensor structure of claim 14, wherein the one or more mesa stripes comprise a body region between the source region and the drain region, and wherein the further mesa stripes comprise another body region between the other source region and the drain region, the body region and the other body region comprising a doping of the semiconductor substrate which is complementary compared to the drain region.

16. The semiconductor sensor structure of claim 14, wherein the other field-effect transistor is a current sensor for the power field-effect transistor (DMOS), the other field-effect transistor and the power field-effect transistor (DMOS) being coupleable to an equal drain potential and to an equal gate potential.

17. The semiconductor sensor structure of claim 14, wherein an insulation region is formed between the body region and the other body region and the body region comprises an electrical contacting to the contact area and the other body region comprises another electrical contacting to the other contact area.

* * * * *